United States Patent [19]

Schuster et al.

[11] Patent Number: 5,086,397
[45] Date of Patent: Feb. 4, 1992

[54] METHOD AND APPARATUS FOR DATA COLLECTION OF TESTING AND INSPECTION OF PRODUCTS MADE ON A PRODUCTION ASSEMBLY LINE

[76] Inventors: Pamela K. Schuster, 14214 Langbourne, Houston, Tex. 77077; James W. Strong, 601 Clarence, Tomball, Tex. 77375; Marvin C. Conrad, 13330 Rain Lily, Houston, Tex. 77083

[21] Appl. No.: 381,270

[22] Filed: Jul. 18, 1989

[51] Int. Cl.$^5$ ................. G06F 15/46; G06F 15/20
[52] U.S. Cl. .................... 364/468; 364/507; 364/490; 364/551.01
[58] Field of Search .............. 364/468, 478, 507, 550, 364/551.01, 552, 579, 149–151, 164, 156, 165, 184–187, 488–491; 358/101, 106, 107

[56] References Cited

U.S. PATENT DOCUMENTS

| | | | |
|---|---|---|---|
| 3,751,647 | 8/1973 | Maeder et al. | 364/151 X |
| 4,173,441 | 11/1979 | Wolf | 364/507 X |
| 4,389,669 | 6/1983 | Epstein et al. | 364/474.22 |
| 4,454,585 | 6/1984 | Ele | 364/552 X |
| 4,752,897 | 6/1988 | Zoeller et al. | 364/550 |

*Primary Examiner*—Joseph Ruggiero
*Attorney, Agent, or Firm*—Gunn, Lee & Miller

[57] ABSTRACT

A method and apparatus to enable real time recording and analysis of defects in manufactured products and expedite real time identification and correction of errors in production and assembly operations is provided. It is intended for use where a multitude of different parts are used to make multiple units of a device typically formed by stuffing components into a printed circuit board, therebeing one or more printed circuit boards in the finished assembly typically having a chassis and wiring harness. Support for fully integrated multiple inspection stations is disclosed. The inspection stations include terminals utilizing light pens and screens to input codes classifying defects, and also includes facilities and functions to capture defect data from automatic testing equipment. Real time output of defect indications and trends including classification thereof is provided both at the station, and through reporting stations distant from the manufacturing floor.

14 Claims, 1 Drawing Sheet

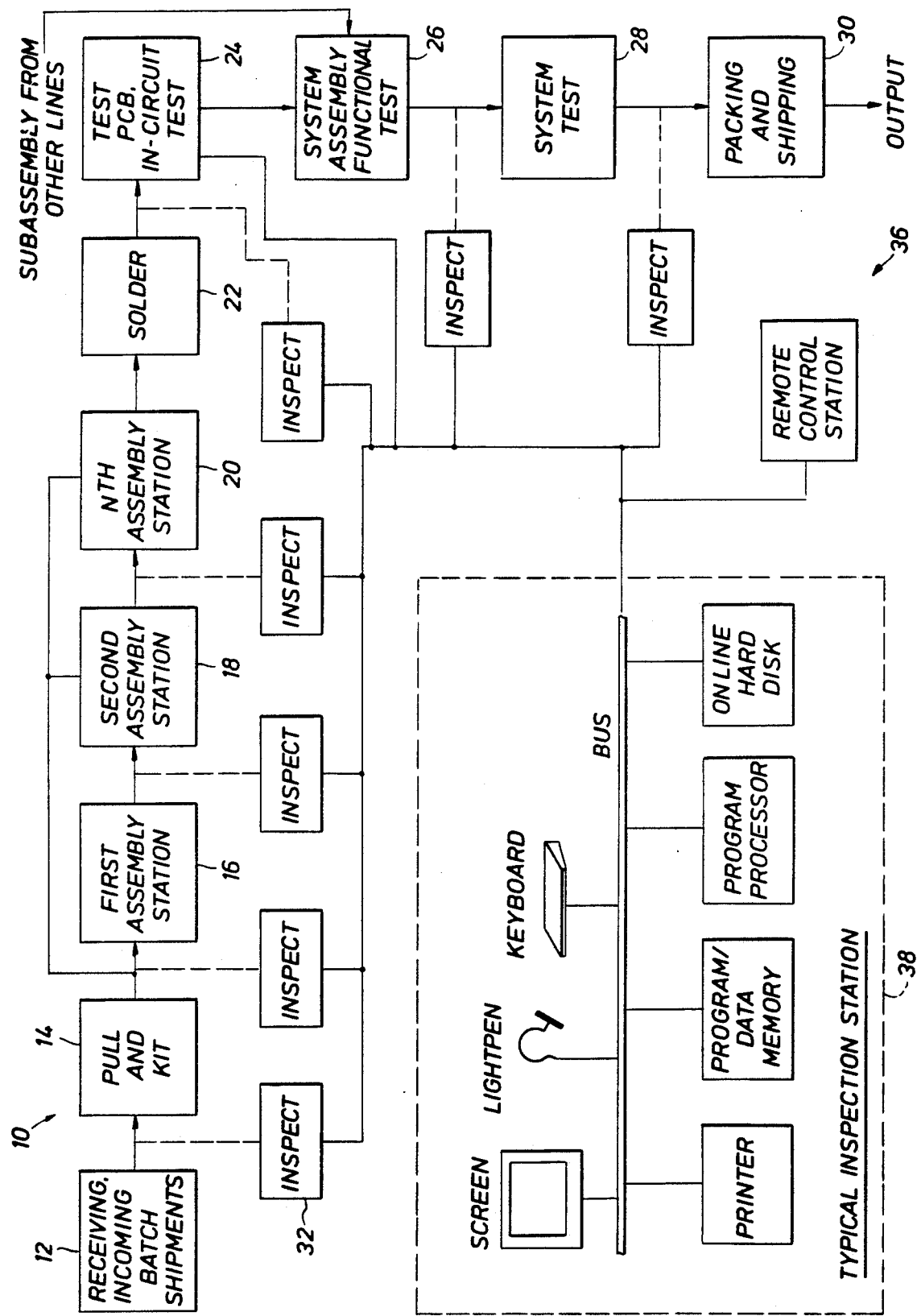

METHOD AND APPARATUS FOR DATA COLLECTION OF TESTING AND INSPECTION OF PRODUCTS MADE ON A PRODUCTION ASSEMBLY LINE

BACKGROUND OF THE INVENTION

The present disclosure is directed to a method and apparatus for evaluating quality and productivity in an assembly line situation. It is particularly intended for use with electronic component assembly and will be described in that context, namely a situation where typical electronic components are mounted on a printed circuit board (PCB) and one or more such boards are assembled into a system typically placed on a chassis, connected with a wiring harness, and are packed and shipped representing as the output of the assembly line. A typical system such as a stereophonic receiver, computer or other electronic device is as simple as a few components or as complex as can be required, often over a thousand components. Whatever the range of complexity, the present disclosure describes a method and apparatus for evaluation of process, assembly and test operations both during and subsequent to production.

The present disclosure is particularly directed to a real time evaluation system which provides immediate indication of problems in the manufacture and assembly on a typical PCB. Real time determination of problems and difficulties in the manufacture of such devices is important. The real time analysis provides far greater assistance in the operation of an assembly line for stuffing typical components into a PCB, soldering the components, running board tests, assembling several boards into a system typically requiring a chassis and wiring harness, and executing the other steps necessary to make the finished product. Whether the device has fewer than ten components or more than 1,000 components, real time analysis of the defect data is extremely useful in improving the proficiency of the production operations. Heretofore, product inspection has typically been by visual input, compiled on data sheets representing score cards of defects, and the data sheets have been collected on a batch basis. In addition, some assembly lines will utilize an occasional automatic testing equipment (ATE) which tests a partially or totally completed PCB with a set of electrical tests. Such data is typically collected along with the hand written reports from one or more inspection stations and all the data is thereafter grouped for a time interval, perhaps a week or so, and the data is compiled into reports which are then diagnosed. However, even while data is being collected to obtain a meaningful statistical basis so that production changes can be made, product is made continuously, and to the extent that defects are likely in the production situation, then the number of product rejects simply accumulates. PCBs rejected typically are handled on a rework basis, although there are occasions where it is economical to simply scrap the rejects without attempting rework. Whatever the response, to the extent that error analysis is not implemented in real time, to that extent the cost of rejects becomes unacceptable.

Consider a relatively complex system where the historical rejection rate is 25%. It is possible in accordance with previous practice to accumulate data for manufacture of a large number of units, say 1,000 units, test the 1,000 units, determine the basis on which 250 units ought to be rejected, collect data regarding the 250 units and analyze that data with a view of making corrections to the manufacturing procedure. Statistical analysis normally suggests that after the collection of this set of data that certain specific difficulties exist which can be dealt with. Some causes for rejection may have a more random nature and be less susceptible to statistical analysis.

By implementing the apparatus and method of the present disclosure, an entirely different approach can be accomplished. First of all, data is collected on a real time basis and made available for real time analysis. The data is processed on a real time basis so that the number of units which are rejected is inevitably reduced. More importantly, the analysis of defect data gives rise to more prompt corrections. If changes in the assembly line are implemented promptly, the possibility of 100% acceptance of the production run is much more likely. In fact, with real time data furnished, one need not wait for an accumulation of data to obtain statistical analysis. In other words, while conventional wisdom suggests accumulating data over a long interval, the present disclosure surprisingly enables implementation of early changes, such early changes enabling complete rearrangement of the process and thereby enabling acceptance improvement, even approaching 100% acceptance. This is otherwise impossibly difficult but for the implementation of the present disclosure.

Details of the disclosed apparatus and procedure will become more readily apparent upon consideration of the below written specification in conjunction with the drawings affixed to the present disclosure. It will be understood that this disclosure is set forth in the context of a complex electronic device which requires one or more PCBs which are assembled into a chassis, and to that extent, the assembly line is represented in a generalized fashion for electronic equipment manufacture including mounting of components, clipping component leads, soldering multiple components simultaneously typically using a wave solder machine, and conducting many other operations that are typical for manufacture of a complex electronic device.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments and may be applied equally effectively to all production processes and assembly operations.

IN THE DRAWINGS:

The single figure is a block flow chart showing multiple stages in an assembly line and further showing the inspection apparatus of the present disclosure incorporated with the assembly line for real time data capture and analysis.

DETAILED DESCRIPTION OF THE PREFERRED EMBODIMENT

Attention is directed to the only drawing which shows in block flow chart form an assembly line generally indicated at 10. The assembly line 10 includes multiple work stations for manufacture of a product to be described and wherein an inspection recording and analysis system is incorporated to support real time evaluation of manufacturing defects as will be described. The description will therefore focus first on the manufacturing procedure, and thereafter the real time inspection benefits will be described.

The assembly line 10 has a work station which is identified at 12. There, the components required for manufacture of the product are received, typically but not necessarily being received in batch fashion. Representative components include a stack of multiple PCBs appropriately drilled and coated in the customary fashion. Ordinarily, the components received at 12 will include resistors, capacitors, integrated circuits, etc. For explanation purposes, assume that several resistors, capacitors, etc. are required to be mounted on several PCBs to manufacture the desired product. To provide a full range of examples, assume that the product made by the process carried out at 10 on the assembly line requires 50 resistors which will be indicated hereinafter by their "reference designators" as $R_1, R_2, \ldots R_n$. Assume also that it requires 50 capacitors which are identified as $C_1, C_2, \ldots C_n$, and that integrated circuits are identified as $U_1 \ldots U_n$ and that all other components are appropriately identified. Assume further that in the normal fashion the incoming batch shipments are visually inspected and are then passed to the next work station 14 where the parts are separated into appropriate groups and grouped as kits of parts. The kits of parts are then delivered to the assembly stations which are identified at 16, 18 and 20. Ordinarily, the PCB is stuffed with certain of the components at the first assembly station 16, then passed to the second assembly station where additional components are stuffed into the PCB. Ultimately, the PCB is then passed to the last or Nth assembly station 20 where the required components are assembled on the PCB. At each station, additional components are installed until all the components have been mounted on the PCB. Ordinarily, those components which are supported on leads are placed in holes drilled through the PCB. The leads on the various components mounted on the PCB are trimmed, and the board is then soldered. The work station 22 identifies the next step in manufacturing where the soldering occurs. Typically, the PCB is mounted on a jig and is passed over solder by a wave soldering machine. All the component leads are soldered to complete this step of manufacturing.

Often, a partially or totally completed PCB is delivered to a automated test station 24. One such device is provided by the GENERAL RADIO firm and is sold under the trademark GenRad ATE. This is an automated testing machine which performs certain electronic tests on the completed PCB.

The next step typical of the step of manufacturing is identified at 26 and is the system assembly step. Here, two or more PCBs necessary for the completed electronic system are brought together with the chassis and wiring harness. In the example of a stereophonic receiver, assume that the receiver has a chassis, a wiring harness and six separate and different PCBs. The other subassemblies (such as PCBs) are collected and the system assembly step is carried out at 26. This finishes the completed unit which is a stereophonic receiver in one example. Other examples can be selected including a computer incorporating a CPU, memory, various switches, electrical connections, power supply and the like, all mounted in a common chassis. Finished assemblies (and sub-assemblies) will be described generally hereinafter as the "product", referring to a completed assembly or sub-assembly. The product is then transferred to the next test station which in the example is the system test location 28 at which location the apparatus final assembly and system test is performed. If the apparatus includes multiple circuit boards, they are all assembled in the chassis and connected with the wiring harness so that the entire product is tested in some type of test routine or procedure. The next work station in the assembly line is packing and shipping identified at 30. The completed products are then shipped to a warehouse or for distribution.

For purposes of the present example, assume that the work stations 16-24 are involved in the fabrication of a single PCB; assume further that other PCBs are fabricated on other assembly lines similar to the line shown, and that such additional assembly lines are inspected in the same fashion. Further, assume that the system assembly work station at 26 involves assembly of all the necessary components so that the completed unit is made. As used hereinafter, the term "unit" refers to one of the finished product, one example being a stereophonic receiver. The system assembly step 26 thus involves bringing together the chassis and all the appropriate parts including the several PCBs and connecting them all together with a wiring harness.

Going now to the present apparatus, the system is identified generally at 36 and refers to the inspection recording and analysis system. Assume for purposes of description that the first test station 32 is located to test the incoming batch shipments, and assume further that such testing is selectively performed on certain of the component parts. Such parts are tested in the appropriate fashion and an indication thereof is input at the station 32. The system 36 embodies a hard disk for data capture at each point of entry. Thus, the user or manager at the remote control station can perform line wide correlation analysis by process type, assembly class, operator, shift, etc. All network interactions with the data are performed concurrently with data acquisition, and are available to the line inspectors and operator. Data is presented directly to the station or line operators in any form to identify urgent problems to solve. Each inspection station 38 is self contained and designed for reliability. If any element of any station malfunctions, the remainder of the system 36 stays up and operates normally. The equipment at the inspection stations 38 include a CRT terminal which provides a screen which can be marked with a light pen. This properly encodes defect data for the Program Processor where the data is processed in a fashion to be described. The CPU is further provided with program/data memory and a printer or other output device for optional hard copy output. The CRT terminal provides a real time indication of the inspection results.

A typical next step is organization of the parts into a kit of parts. Such kits are organized for the various work stations 16, 18 and 20. Perhaps an example will assist in describing this. Assume for purposes of discussion that one PCB board is to have installed thereon 50 resistors, 60 transistors, and 30 capacitors. The process may distribute the various components among the illustrated work stations. The PCB is thus stuffed with some portion of the pieces, perhaps 20 resistors, 20 transistors, and 10 capacitors. The parts are organized for the work so that the first assembly station 16 is provided with these parts but no others. If 20 resistors are mounted at the first station, the resistors are grouped so that the 20 designated resistor values are available. If the goal is to assemble 100 units per shift, then 100 sets of parts are delivered at the first assembly station 16. That is, $R_1$ is provided with 100 resistors, $R_2$ is also provided with 100, etc. In like fashion, parts for 100 units are provided for the workstation 16 so that all the desired resistors, capacitors, transistors, etc. can be stuffed in accordance with the work assignment for the first assembly station. In like fashion, the second and Nth work stations are provided with similar kits of parts and assembly resources. When the work stations are organized, they are preferably allocated certain assembly operations so that the three work stations 16, 18 and 20 have a balanced work load requirements.

The first, second and Nth kits of parts (for 100 units) in this example are then delivered to the work stations, and the first station can begin by assembly of the first station components, placed on the PCB.

Several inspection stations are shown and all preferably are identical. All of these stations provide data which is immediately available locally and to other networked stations of the form at 38. The data is manipulated in the fashion to be described so that the operator is presented with a real time report of the output production as each unit is inspected. The data collected is analyzed to enable real time output in a fashion to be described below. Operation of the inspection apparatus will become more readily apparent by describing one example of its use.

Assume that the unit which is being manufactured includes 50 resistors, 20 of which are installed at the first assembly station 16, the next 20 being installed at the second assembly station 18, and the remaining 10 installed at the third work station which is the last or the Nth work station. Assume further that the resistors are identified as $R_1$ through $R_{20}$ for the first work station, $R_{21}$ through $R_{40}$ for the second work station and $R_{41}$ through $R_{50}$ for the third work station. Assume further that the various resistors are installed on one side only of a PCB, the leads bent and inserted through the holes in the PCB and are clipped so that excessive lead length is removed. Assume further that all the resistors are marked with appropriate locations on the PCB, thus, the location of $R_5$ is indicated on the PCB between a pair of holes which serve as the mounting holes to receive the resistor in place. Assume further that the assembler is provided with a layout showing the partially assembled PCB with the various components placed on the PCB at least insofar as the first work station is concerned. In light of the foregoing assumptions, the process proceeds in the following fashion. First of all, a number of kits of parts are collected and are placed at the first assembly station. Under the assumption that 100 units will be made during the shift, 100 duplicate sets of parts are placed at the station 16 or in this example, 100 sets of the resistors $R_1$ through $R_{20}$. The first PCB is then assembled by the person working at the station 16 where the resistors $R_1$ through $R_{20}$ are installed on the PCB, excessive length of the leads is trimmed off, and the PCB is then prepared for soldering to connect the 20 resistors.

Assume for purposes of description that an error in the installation of $R_5$ occurs at station 16. Assume further that this error is an error that can be generally classified. Under these assumptions, the partially assembled, partially completed PCB is transferred from the first assembly station 16 to the next station 18. It does, however, go through the inspection station 46 which has been tooled for execution of the present invention. At that station, the operator is provided with a screen on a terminal and where the screen provides a number of standard error notations. For instance, the first notation placed on a screen can be a grouping of prospective errors in the fabrication of the unit. The grouping is selected from a list including solder, hardware, assembly, component, etc. Using a light pen, the inspector touches the word "component" on the screen. On doing that, the screen would then clear and provide another list for the types of components such as capacitor, inductor, transformer, resistor, integrated circuit, diode, etc. With a light pen, the operator would then touch "resistor". Recall, however, that this work station involves the installation of 20 different resistors. In this example, it is $R_5$ that has the error; after touching the component "resistor", the screen then provides a ten key numeric pad so that the operator could touch one of the numeric pads to input the digit for identification of a particular component. Here, the operator would then touch the light pen to 5 to thereby identify $R_5$. If the component has two or three digits, they can be touched in sequence to identify $R_{37}$ or $R_{215}$ for example. The screen would also provide an enter button so this data can be entered. If desired, the PCB that is being processed at the first work station can likewise be numbered sequentially or provided with a serial number that can be entered in the same fashion. Defect data entered in this fashion is stored permanently at the local station on hard disk provided for that purpose.

The foregoing is one mode of entering data regarding the particular component. That is, the component is classified and identified and that data is then entered. It is equally important to identify the type of error or mistake that the inspector observes at the inspection station 32. Accordingly, another screen is then provided where the inspector can enter classification for the particular error. In this example, assume that the resistor is improperly installed. There are many ways to improperly install a resistor. The typical faults or errors are omission of the resistor, the leads were misbent so that it stood too tall, the leads at one end or the other were not stuck through the correct holes (open hole), the leads were stuck through the wrong holes (misplacement), or other error modes. The list for the type of error (installation of the resistor) can be expanded depending on the typical situations encountered, and a miscellaneous category can be included to cover those particular instances not specifically on the list. The type of error is also input at the inspection station 32 during inspection.

The operator of the inspection station 32 is then free to place the rejected PCB, in a "repair" collection, or otherwise withdraw it from the flow of correct units in the assembly line. This PCB removal can be cost effective because it is probably more economical at this stage to remove the PCB from the assembly line. On occasion, it may be economical to repair the PCB and place it back in the flow of the assembly line 10. That is a decision however, which can be made after removal. In any event, that decision to repair or scrap can be deferred. Removal of the PCB which fails the inspection at the work station 32 reduces waste in the sense that further work toward completing the PCB is avoided. To the extent that repairs are attempted, they are more easily accomplished with fewer components on the board. The defective area on the PCB can be marked with some type of indicator, and equally important, the nature of the defect is then stored in the distributed network 36 to be treated in a fashion described below.

The present procedure utilizes multiple inspection stations along the line. As shown in FIG. 1, a work station is normally accompanied by an inspection station. The number of components installed at each assembly station can be varied. Accordingly, the number of inspection stations can likewise be varied. For instance, if the component count is relatively low, all the assembly may occur at a single station. On the other hand, the assembly shown here involves multiple work stations and therefore multiple inspection steps. After the PCB has been stuffed with all the components, it is delivered to the solder station at 22 and soldering is completed. The soldering step is subject to inspection ordinarily. The person operating the soldering inspection then visually inspects the PCB for the solder that was placed on the PCB, and touches the solder heading with the light pen. This flashes a menu on the screen which includes all typical solder defects such as splash, void, missing, insufficient, bridge, fracture, excess, etc. Visual inspection is made and the type of solder defect is then identified by touching the light pen to the appropriate entry. This category requires additional data to fully identify the nature and location of the solder problem. Location can be identified in a number of ways. For instance, assume that the PCB is provided with printed circuitry on only one side of the board. Assume this is the bottom side. The bottom side can be marked with coordinates along the borders so that the location of the solder defect can be indicated on a coordinate system. Alternately, leads can be given names or other nomenclature, including markings with the name of the component at the various eyelets on the solder leads. Whatever reference system is chosen, a type of reference or location procedure is preferably implemented. Once this is done, the precise location of the solder fault on the PCB can be specified. Again, it may be appropriate to repair the board or it may be cost effective to simply discard the board.

Considering operation of the present invention with the assembly line 10 shown, assume that after soldering that the device is delivered to the test station 24. The test station is provided with a circuit test device, one model being mentioned above. The PCB, including the components stuffed thereon, is delivered to the test station 24 and is then connected to the test apparatus. Various cold circuit test routines are applied to selected terminals of the PCB. After that, hot tests are made of the components on the PCB. Suitable routines can be input to the automated test equipment so that the sufficient routines are performed. At all events, data is entered into the system 36 and is available on the distributed network. It is especially important to provide such data indicating a fault or defect in the system. There are certain types of defects which can not be visually observed. For instance, a capacitor might appear visually acceptable but have an internal short. A resistor may have a short or open and thereby provide resistance other than the value marked on the resistor. The list of potential difficulties need not be exhausted here but it is admitted for the present disclosure to comprise one or more types of defects particular components having internal latent defects. Accordingly, the screen is provided with a set of typical defects and such defects include notations such as value low, value high, open, short, and the like.

The test apparatus at 24 is typically capable of operating the PCB both without power and with power to make measurements at various test points (conventional test points or pins in the test fixture) of the stuffed and soldered PCB. The tests are made in accordance with protocols installed in the test equipment. Acceptable and unacceptable results are also classified. From that, conclusions can be drawn which indicate the nature of the fault(s) in the assembled PCB. Accordingly, that data is output from the test station 24 is and delivered into the distributed network 36.

Assume for purposes of description that the assembly line including the work station 16, 18 and 20 forms a first PCB. Assume further that additional but different PCBs are required for the assembled and finished unit. They are made on other assembly lines that are arranged for fabrication in similar fashion; the present disclosure can be extended to include inspection stations for all PCB assembly lines in similar fashion. Therefore, the stuffed, soldered and tested PCBs from the other lines (one or more) are delivered to a system assembly 26. This work station normally involves the assembly of multiple completed subassemblies, the subassemblies being the chassis on which the equipment is mounted, the wiring harness which is installed in the chassis, and two or more different PCBs with the component thereon. This step can be broken down into sub steps, i.e. intermediate inspections can be made, as for instance testing the wiring harness after installation, testing various terminals of the wiring harness after application of power by the power supply with only one board installed and thereafter with additional boards, etc. In any event, this assembly step 26 devises a completed unit which is then inspected. One part of this inspection can be accomplished without power. The completed unit can then be delivered to system test at 28 where power is applied and the appropriate tests are applied. Again, if desired, an automatic testing equipment can be incorporated and to this end, data is output indicative of testing results. Thereafter, the finished product is delivered to the packing and shipping station 30 where it is appropriately boxed and shipped.

Summarizing the assembly line, it operates in the conventional fashion, but the present distributed system 36 is interposed on the assembly line 10 at appropriate locations to provide product success and defect data indicative of problems in production process and assembly operations. If the product being made has fewer than ten components, the number of inspection stations may be reduced to as few as one or two stations. On the other hand, if the assembly has hundreds of components and involves several different circuit boards, a chassis and wiring harness, 8, 10 or more inspection stations should be incorporated. The various inspection stations typically are of two types. One is the automated testing equipment, one example being that attached to the Gen-Rad product mentioned above. The second type of station is a manual inspection station at which operating personnel are equipped with a terminal 38 so that data is entered by means of a light pen at the terminal. The terminal typically includes a light pen and key board for entry of data. Moreover, the data is entered as soon as the partially completed subassembly or assembly is received or inspected. This permits the data to be entered and transferred from all inspection stations in the system 36. In addition to this reporting function, the defect is likewise classified. The ability to classify the defect is particularly helpful.

Consider the following example where data classification will become more apparent. Assume that a relatively complex system having many components is made and further assume that 75% of the units have been acceptable historically. Assume further that no intermediate inspection had been made before, but the present invention is then imposed on the assembly line 10 for the express purpose of raising acceptable production from 75% to at least 95%. If a typical production run is 1,000 units, this would indicate that 250 units would normally be rejected and either reworked or scrapped. As soon as the system 36 provides an indication of any repeated defect, there is an indication that the defect is probably a common error and is therefore likely to be more significant as a cause of 25% rejections. Accordingly, real time warning that this error has occurred enables changes to be made. As an example, it may require changing the workloads of the first and second assembly stations. The tasks may be regrouped so that certain actions required in hand assembly are executed in a different fashion. It may alert to receipt of a shipment of uniformly defective components. It may alert to a defect in the photonegative laying out the PCB conductive paths. Whatever the circumstance, prompt real time warning of the common difficulty is obtained.

Defects entered with the type of identification permitted by the present apparatus can be classified. Consider the following examples which would otherwise appear to be quite different. Assume that the first assembly station errs by inserting $R_5$ in the wrong location. This might cause other personnel further down the assembly line to insert a different component into the location of $R_5$. Assume that they erroneously insert $R_{40}$ into the holes for $R_5$. Merely denoting the existence of wrong values at $R_5$ and $R_{40}$ would provide two unrelated indications. The present apparatus permits analysis of the data so that the correlation of the errors can then be observed. In other words, $R_5$ and $R_{40}$ merely appear to be two separate errors. On entry of the data taught herein, both entries would have the notation that the components were inserted into the wrong locations so that there would be a common tie and it can be indicated by the present system. The classification would then read an error for insertion into the wrong location and would have two entries thereunder. This type classification assists in correction to avoid repetition of the problem.

While the foregoing is not significantly subtle, there are subtle errors which can not be found by means of individual inspectors at individual inspection stations. For instance, in a power supply, if the filter capacitor forms an erratic open circuit, that defect will not necessarily be seen by visual observation, and it will not necessarily be observed by a cold test. It will however, be observed in the automatic test equipment at 24. The diagnostic ATE will then provide an output data promptly upon testing of the power supply PCB indicating such a defect which permits either repair or discarding the power supply PCB. It is far more desirable to catch this type of error by inspection rather than permit the entire system to be assembled with defective components in the power supply which might provide under or over voltage. Obviously, more subtle errors can be imagined for practically every type of circuit, and it is desirable that they all be discovered as early as possible.

The present system thus contemplates real time collection, real time classification and real time notification of errors.

In summary, the present disclosure is directed to a system for real time production fault analysis applied in an assembly line for checking for errors, defects and other difficulties arising in the manufacture of electronic products and particularly where such devices are assembled on printed circuit boards where components are stuffed, leads trimmed, components sorted and the board is thereafter installed in some sort of system. The scope of the present invention is determined by the claims which follow.

What is claimed is:

1. For use with an assembly line where multiple components are assembled into a subassembly and the subassembly is assembled into an assembly by appropriate component installation at locations of the assembly and wherein the assembly line involved multiple assembly functions therealong and further wherein the assembly line manufactures the assembly repetitively, an apparatus for inspecting the components, subassemblies or assemblies as repetitively manufactured, the apparatus comprising:
   (a) at least one inspection station having data input terminal means for use by an inspector to input data relating to manufacturing or component defects as observed after component installation along the assembly line wherein the defects are coded with defect specific codes, and the defects are converted by said terminal means into defect codes;
   (b) output means for forming an indication in real time from data input upon entry of a defect at said terminal means during inspection, said output means forming an output indicative of the defect; and
   (c) a CPU connected between said terminal and said output means, said CPU correlating the output of said output means with the coded defect input from said terminal means and forming a coded indication that the defect has occurred in real time and further forming an indication regarding the significance of the defect.

2. The apparatus of claim 1 wherein said terminal means includes two or more terminals having terminals with inputs therefor to enable personnel to provide coded defect descriptions, and said terminals provide a list of prompts to classify defects.

3. The apparatus of claim 1 wherein at least one inspection includes an automated testing equipment capable of making cold and hot tests of a partially or totally finished assembly and forms output data for said CPU in real time, and said CPU converts the data into standard defect codes.

4. The apparatus of claim 3 wherein said automated test equipment forms defect output data for said CPU, said CPU prompting said output means to form defect correction codes for selected assembly line assembly functions.

5. A method of inspecting the components placed on a printed circuit board comprising the steps of:
   (a) after manufacture by assembly of components onto a printed circuit board, inspecting the components for defects in assembly including assembly errors in component type, value and placement of the board;

(b) after completion of an assembly involving the printed circuit board with additional assembly steps installing additional components, inspecting at a second time for additional defects of the type arising in the additional assembly;

(c) wherein each of the steps of inspecting and inspecting a second time occurs at an input terminal for receiving as observed in real time coded data entries of defects;

(d) classifying the defect coded entries into categories of defects in acccordance with a predetermined standard for defects; and (e) providing periodic reports of classified defects grouped by said predetermined standards wherein said reports represent at assembly errors in component type, value, and placement on the board.

6. The method of claim 5 wherein said reports are in real time with entry by an inspector during the steps of inspection, and occur as entered by light pen at said input terminals.

7. The method of claim 6 including the step of making separate inspections with no signal and then with a signal applied to the assembly after component placement, and forming defects reports in response to said separate inspections.

8. The method of claim 5 including the step of presenting a list of defect classifications to permit selection therefrom.

9. The method of claim 8 wherein the list of defect classifications is presented interactively with a user on a screen, and further including the step of selecting a desired defect from the list and forming a component identifying input thereof.

10. The method of claim 9 including the step of encoding a defect dependent on the component and component designation in product being made on the assembly line.

11. The method of claim 10 including the step of marking with a light pen to indicate product defects.

12. The method of claim 5 the step of inspecting at N stations where N is a whole number integer, inputting defects from the N stations into a networked set of terminals, and forming the output in real time from the terminals.

13. The method of claim 5 including the step of forming first and second sets of defect classifications; then inspecting the defects and utilizing a selected one of the sets of classifications to encode the defect.

14. The method of claim 13 wherein one set of classifications is unique to a type of part, and a second set of classifications is unique to a different type of part.

* * * * *